United States Patent
Rossing et al.

(10) Patent No.: US 9,432,017 B2
(45) Date of Patent: Aug. 30, 2016

(54) DISPLAY WITH TOUCH SENSING SYSTEM

(71) Applicant: HEWLETT-PACKARD DEVELOPMENT COMPANY, L.P., Houston, TX (US)

(72) Inventors: David P Rossing, Poway, CA (US); Stephen M Ledak, Santee, CA (US); Xiaoqi Zhou, San Diego, CA (US); Steven L Webb, Murietta, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 151 days.

(21) Appl. No.: 13/626,180

(22) Filed: Sep. 25, 2012

(65) Prior Publication Data

US 2014/0084990 A1  Mar. 27, 2014

(51) Int. Cl.
*H03K 17/96* (2006.01)

(52) U.S. Cl.
CPC .......... *H03K 17/96* (2013.01); *H03K 17/962* (2013.01); *H03K 17/9645* (2013.01); *H03K 2217/960755* (2013.01); *H03K 2217/960785* (2013.01)

(58) Field of Classification Search
CPC  G09F 3/204; H03K 17/962; H03K 17/9622; H03K 17/9625; H03K 17/9645; H03K 17/9647; H03K 17/96; H03K 17/9618
USPC ................................................. 345/173, 179
See application file for complete search history.

(56) References Cited

U.S. PATENT DOCUMENTS

| | | | |
|---|---|---|---|
| 5,239,152 A * | 8/1993 | Caldwell et al. | 200/600 |
| 5,504,836 A * | 4/1996 | Loudermilk | G09B 5/062 704/201 |
| 6,049,975 A * | 4/2000 | Clayton | 29/832 |
| 6,393,401 B1 | 5/2002 | Loudermilk et al. | |
| 6,809,280 B2 * | 10/2004 | Divigalpitiya et al. | 200/512 |
| 6,819,316 B2 | 11/2004 | Schulz et al. | |
| 7,109,977 B2 * | 9/2006 | Durso | 345/173 |
| 7,242,393 B2 * | 7/2007 | Caldwell | 345/173 |
| 8,648,832 B2 * | 2/2014 | Maloof et al. | 345/174 |
| 2003/0121767 A1 * | 7/2003 | Caldwell | 200/512 |
| 2009/0284487 A1 * | 11/2009 | Nakanishi et al. | 345/173 |
| 2010/0224469 A1 * | 9/2010 | Byrne et al. | 200/308 |
| 2011/0016759 A1 * | 1/2011 | Ramos-Gonzalez | A47G 1/0633 40/773 |
| 2011/0069024 A1 * | 3/2011 | Kim | 345/173 |
| 2011/0146125 A1 * | 6/2011 | Orme-Johnson | A47G 1/0616 40/725 |
| 2011/0258893 A1 | 10/2011 | Mayer et al. | |
| 2011/0272260 A1 | 11/2011 | Wallace et al. | |
| 2013/0032414 A1 * | 2/2013 | Yilmaz et al. | 178/18.06 |
| 2013/0056243 A1 * | 3/2013 | Kim et al. | 174/250 |

OTHER PUBLICATIONS

Quick, D., "Smarter Touch Surfaces with New Pressure Sensitive Technology," Aug. 28, 2009. <http://www.gizmag.com/pressure-sensitive-touchpad/12638/>.

* cited by examiner

*Primary Examiner* — Quan-Zhen Wang
*Assistant Examiner* — Xuemei Zheng
(74) *Attorney, Agent, or Firm* — HP Inc. Patent Department

(57) ABSTRACT

In one embodiment, a kit for making a touch-sensitive personalized display includes a first medium that is foldable according to score lines to form a cavity. The first medium includes an adhesion surface to receive a personalized second medium, and a back surface opposite the adhesion surface. The second medium includes a personalization surface to receive a user selected-image, and includes a rear surface opposite the personalization surface to adhere to the first medium's adhesion surface. The kit includes a conductive touch sensing system to detect a user touch at the personalization surface and to trigger an action at an electronic device responsive to detection of the touch.

19 Claims, 8 Drawing Sheets

DISPLAY WITH TOUCH SENSING SYSTEM

BACKGROUND

Many televisions, audio systems, computers and other electronic devices have the capability of being controlled by a touch-sensitive input interface or device. Such input interfaces allow a user the flexibility to change functionality or settings of electronic devices with the convenience of touch control. Some such input devices are separate from the electronic device to be controlled, such that user can remotely operate the electronic device.

BRIEF DESCRIPTION OF THE DRAWINGS

The accompanying drawings illustrate various embodiments and are a part of the specification. The illustrated embodiments are examples and do not limit the scope of the claims. Throughout the drawings, identical reference numbers designate similar, but not necessarily identical elements.

The same part numbers designate the same or similar parts throughout the figures.

DETAILED DESCRIPTION OF EMBODIMENTS

Figure 1:
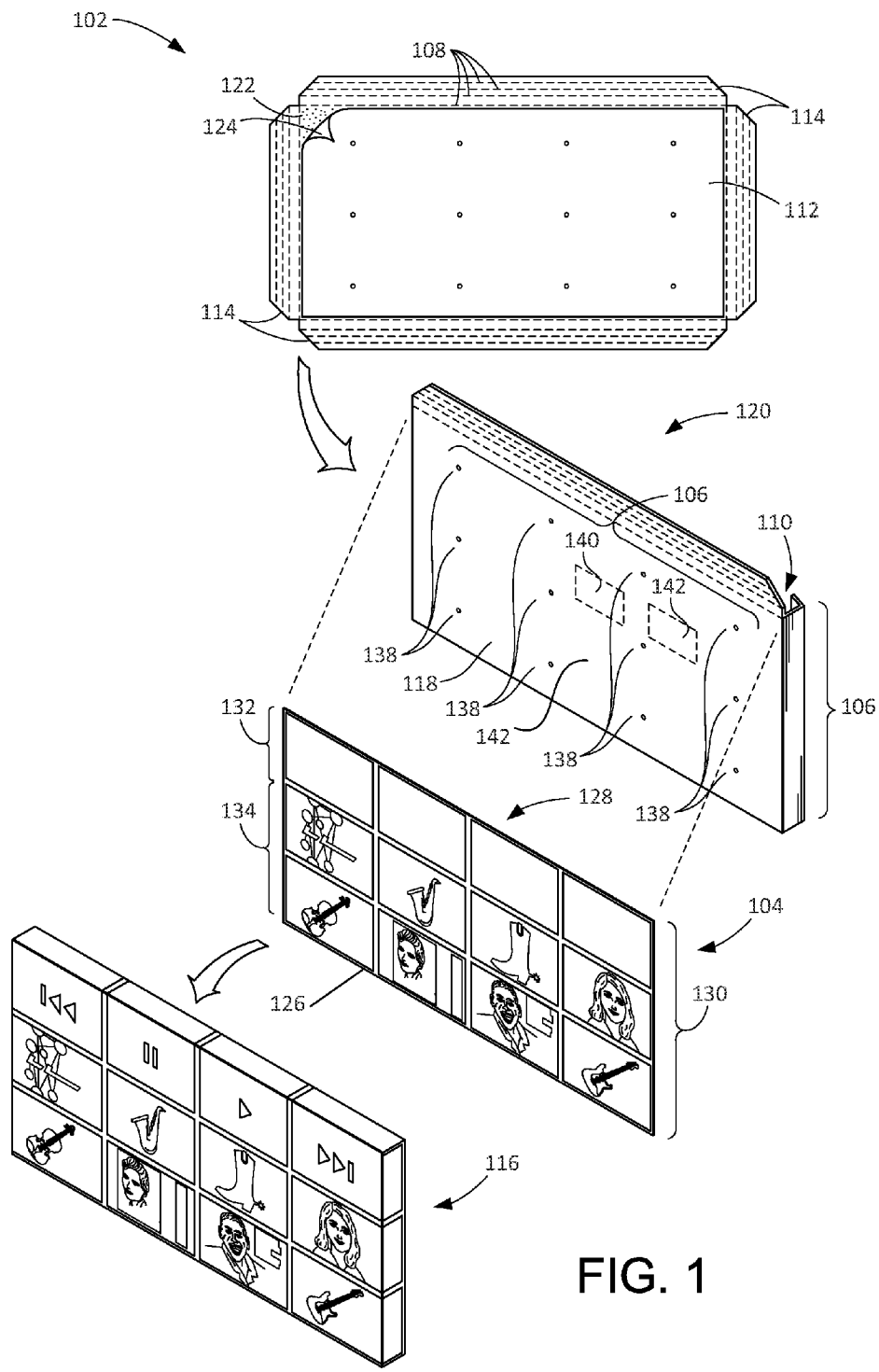
FIG. 1 provides views of a kit to form a display with a foldable first medium, a personalizable second medium, and a conductive touch sensing system, according to various embodiments.

The touch-sensitive input units provided or available to users to control a computer, television, or other electronic device are typically generic in appearance. For example, the remote input devices provided by manufacturers to control a television, a DVD player, a stereo receiver, a cable or satellite converter unit will be box-like and metallic in appearance and are thus quite noticeable in a household or office in comparison with other room accessories. Further such remote input devices frequently closely resemble each other, leading to user confusion. The accumulation of multiple generic-looking input devices in a household thus may lead to customer dissatisfaction with the input device.

Accordingly, various embodiments described herein were developed to provide a display with a personalization surface and a conductive touch sensing system, and a kit for making the display with a personalization surface and a conductive touch sensing system. In addition to triggering actions in a DVD player, a stereo receiver, a cable or satellite converter, computer or other electronic device, the touch-sensitive display functions as a stand-alone household decoration or as a hanging wall decor. Examples of this disclosure include faux canvas digital prints with an appropriate electronic to detect a touch location on the surface, which would then trigger an action, such as a computer playing an audio file.

In an example of the disclosure, a kit for making a personalized display includes a first medium that is foldable according to score lines to form a cavity. The first medium includes an adhesion surface to receive a personalized second medium, and a back surface opposite the adhesion surface. The second medium includes a personalization surface to receive a user selected-image, and includes a rear surface opposite the personalization surface to adhere to the first medium's adhesion surface. The kit additionally includes a conductive touch sensing system that during operation detects a user touch at the personalization surface. In response to the detection of the touch, the conductive touch sensing system triggers an action at an electronic device. Advantages of the disclosure include that a user can create an inexpensive, personalized artwork that performs the functions of one or more remote control devices, thereby reducing the number of generic remote control devices to be managed, and hidden away when not used. Rather than facing a daunting task of finding and managing of several similar-looking remote control devices, the user can utilize touch controls to manage the device via an electronic control apparatus that is also an aesthetically pleasing or comforting artwork.

As used in this application, a "digital printer" or "digital printing device" refers to any electronic device that prints a digital based image onto a media. Examples of digital printers include inkjet printers, piezoelectric printers, electrophotographic printers, liquid electrophotographic printers, and solid ink dye-sublimation printers. A "digital printer" or "digital printing device" includes any multifunctional electronic device that performs a function such as scanning and/or copying in addition to printing. "Image" refers to a representation or rendering of an object, scene, person, or an abstraction such text or a geometric shape. A "conductive" touch sensing system refers to a system that detects a user touch by virtue of a conduction of electricity caused by the touch, or by an affect on an electrical charge that was caused by the touch. A "conductive element" refers to an element at that has the property of conducting electricity. A "command target area" refers to a portion of, or geography within, a personalized second medium that is associated with a command to be sent to an electronic device. A "database" refers to any organized collection of data in digital form such that it can be stored in computer memory or a data storage device. A "tab" refers to a projection from or appendage to a medium.

FIG. 1 provides views of a kit to form a touch-sensitive display, according to various embodiments. The kit of FIG. 1 includes a foldable first medium 102, a personalizable second medium 104, and a conductive touch sensing system ("CTTS") 106. In an example, the first medium 102 may be first medium that includes score lines 108 and is foldable according to the score lines 108 to form a cavity 110. In certain embodiments, the folding of the first medium 102 is such that the cavity is formed in the shape of a concave. In an example, the first medium 102 may be a cellulose product, such as a cellulose card stock, corrugated fiberboard or other paperboard. In other examples, the first medium 102 may be made of any lightweight foldable material, including, but not limited to a pure element such as an aluminum foil, a compound of multiple elements such as a copper-zinc alloy foil, a synthetic polymer such a polypropylene, or a composite such as $PET/CaCO_3$ coextruded sheet.

Continuing with the example of FIG. 1, the first medium 102 includes a center portion 112 and four extensions 114, with each extension to be folded four times according to the score lines 108 on the extension 114 to form a rectangular polygon display 116. In other examples, the first medium is configured to, when folded, form a frame or support for a display that is other than a rectangular polygon (e.g., a triangle, or an oval). In a certain example, each extension may be folded three times upon itself to form a frame or support for the display. In other examples, each extension may in a form to be folded more than four times upon itself.

The first medium 102 includes an adhesion surface 118 and a back surface 120 that is opposite the adhesion surface 118. The adhesion surface 118 is a surface to receive a personalized second medium 104. In the example of FIG. 1, the foldable first medium 102 additionally includes an adhesive layer 122 established upon the adhesion surface 118. The adhesive layer 122 may be in the form of a glue, resin, or any other sticky material to promote adhesion of a personalized second medium to the adhesion surface 118 of the first medium 102. In an example, the foldable first medium 102 also includes a removable liner 124 positioned on the adhesive layer 122. The removable liner 124 is to keep the adhesive layer 122 from sticking to other kit or display materials, or a user, prior to the adhesive layer's intended use to cause adhesion of the personalized second medium 104 to the first medium's adhesion surface 118.

The second medium 104 includes a personalization surface 126 to receive a user selected-image, and includes a rear surface 128 opposite the personalization surface 126 to adhere to the first medium's adhesion surface 118. The second medium 104 may be in the form of, but is not limited to, a cellulose print medium or a polymeric print medium. In examples, the personalization surface 126 may be a smooth, glossy, shiny surface. In other examples, the personalization surface 126 may be in the form of a satin, matte or other textured surface. In one example, a satin personalization layer includes a matte agent with fillers in the personalization layer, e.g. ground calcium carbonate, clay or organic beads such as polyethylene dispersions. In an example, the matte agent has a large particle size (e.g., from about 20 μm to about 50 μm). In another example, the matte agent is a hollow polymeric particle, wherein from about 20% to 60% of particle volume is occupied by air voids.

The personalization surface 126 is to be personalized with a user-selected image 130 to enhance the appearance of the touch-sensitive display, e.g. to render the display appropriate as a standalone household decoration or a wall decoration. In examples, the user-selected image 130 is to be printed to the personalization surface 126 using a digital printer. The digital printer used to print the user-selected image 130 may be any type of printing device, including, but not limited to an inkjet printer, a piezoelectric printer, an electrophotographic printer, a liquid electrophotographic printer, or a solid ink dye-sublimation printer. In the example of FIG. 1, the personalization surface 126 of the second medium 104 is shown with a user-selected image 130 that has been applied to the personalization surface 126 with a digital printer. In this example, the printed personalization image 130 includes printed device control icons 132 (e.g., icons to command an electronic device to "rewind", "pause", "play", "fast forward", etc.) and music type icons 134 (e.g., icons to select music types such as "country", "rock", "classical", "jazz", "fusion", individual artists, etc.)

Continuing with the example of FIG. 1, an example kit includes a CTTS 106, configured to detect a user touch at the personalization surface 136 and to trigger an action at an electronic device responsive to detection of the touch. In this example, the CTTS includes a plurality of conductive elements 138 electronically connected to or connectable to a voltage application component 140 and a signal processor 142. In an example, the conductive elements 138 may be incidences of, or include, conductive wire or conductive tape that are embedded in or attached to the first medium 102 at a command target area 202 (FIG. 2), to detect a user touch at a command target area 202. In another example, the kit may be, or include, conductive elements that are incidences of conductive wire or conductive tape that to be attached to the first medium 102, to detect a user touch at a command target area 202. In yet another example, the kit may include conductive elements that are incidences of, or include, conductive ink applied to the personalization surface 126 at a command target area 202.

Figure 2:
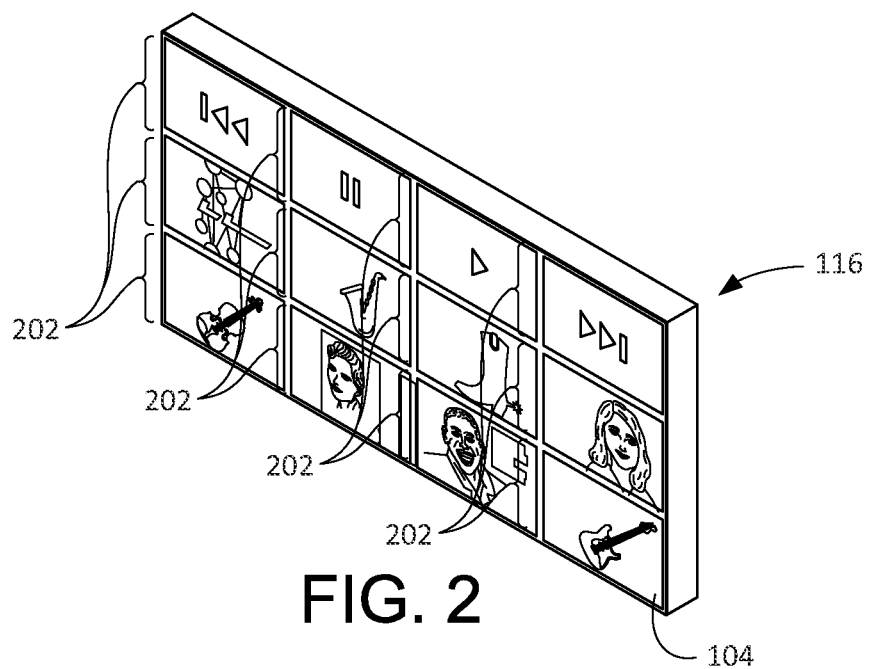
FIG. 2 provides a front view of an assembled display including a personalized second medium, the medium having a personalization surface with a plurality of command target areas, according to various embodiments.
Figure 3:
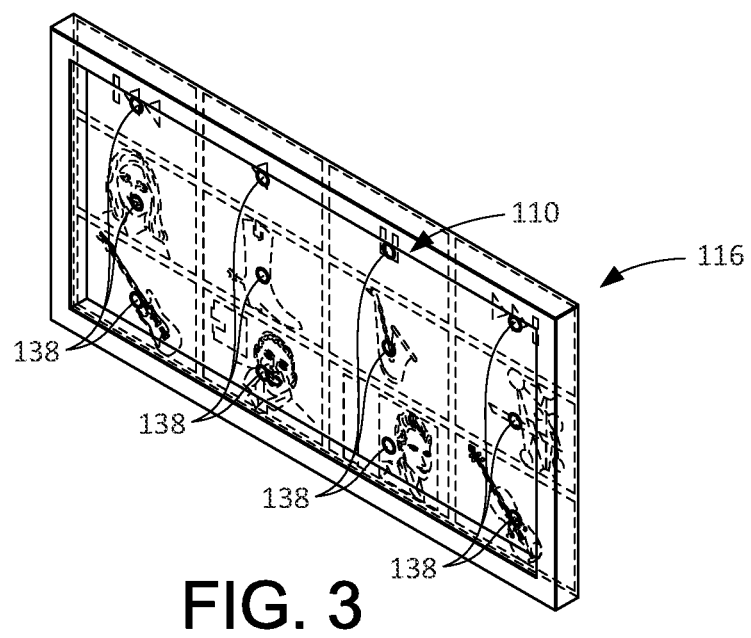
FIG. 3 is a back, transparent perspective view of the assembled display of FIG. 2, according to various embodiments.

FIG. 2 provides a front view, and FIG. 3 provides a rear view, of the assembled display 116 of FIG. 1 after folding of the blank extensions 114 (FIG. 1), adhering of the extensions 114, and adhering of the personalization surface 126 to the blank 102. The display 116 includes a second medium 104 (FIG. 1) the medium having a personalization surface 126 (FIG. 1) attached to the first medium's adhesion surface 118 (FIG. 1). In this example, the kit includes a CTTS 106 (FIG. 1) attached to the first medium's back surface 120 (FIG. 1). In the example of FIGS. 1-3, the touch sensing system 106 includes a plurality of conductive elements 138, and the personalization surface 126 includes a plurality of command target areas 202 with each area having an associated conductive element. In the example of FIGS. 1-3, twelve conductive elements are attached to the back surface 120 of the assembled display 116, with each conductive element uniquely associated with one of the twelve command target areas 202 designated by the device control icons 132 (FIG. 1) and the music type icons 134 (FIG. 1) that are printed on the personalization surface 126 of the display 116.

Each of the command target areas 202 depicted in FIGS. 1-3 refers to a portion of, or geography within, the personalized second medium 104 that is associated with a command to be sent to an electronic device. In this example, the printed device control icons 132 and music type icons substantially define command target areas 202. In other embodiments, depending upon the type of electronic device to be controlled by the display 116, the icon selection and command target area 202 layout upon the personalization surface 126 will differ from this example.

Figure 4:
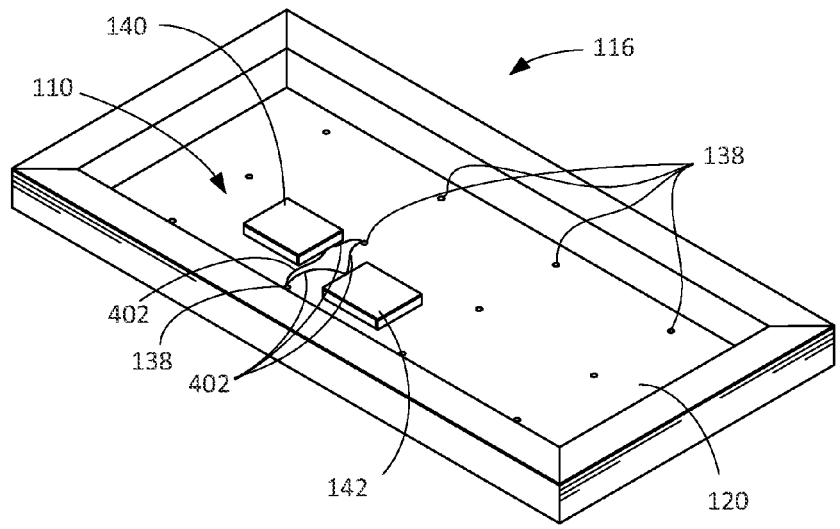
FIG. 4 is a back, perspective view of the assembled display of FIG. 2, according to various embodiments.
Figure 5:
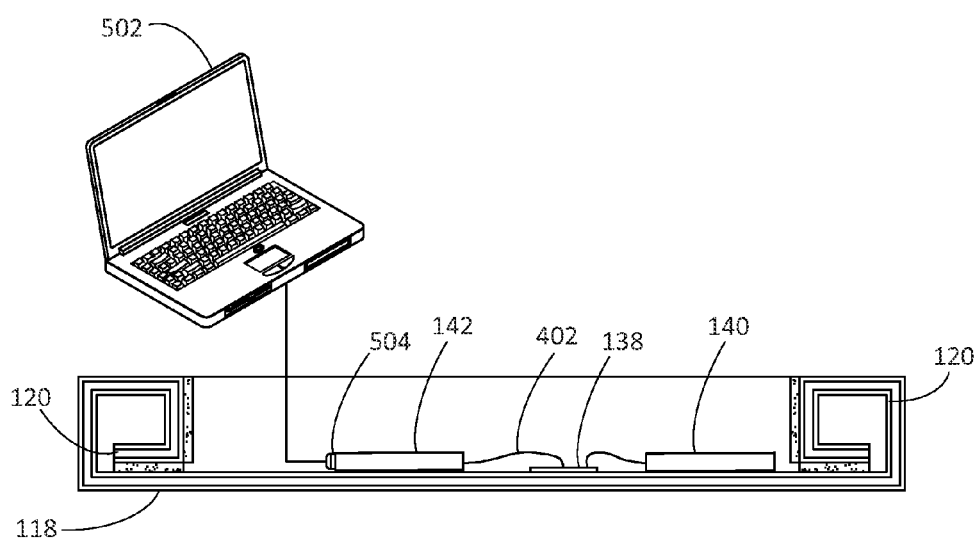
FIG. 5 is a cross-section view of the display of FIG. 2, according to various embodiments.

FIG. 4 is a back, perspective view of the assembled display of FIGS. 1-3, according to various embodiments. FIG. 5 is a cross-section view of the assembled display of FIG. 2, according to various embodiments. For sake of clarity, FIG. 5 illustrates one conductive element 138 rather than the full set of conductive elements shown in FIGS. 1 and 3. Notwithstanding the illustration of one conductive element, the example of FIG. 5 should be viewed as illustrating the plurality of conductive elements 138 electronically attachable or attached to the signal processor 142 and the voltage application component 140 via leads 402 as shown in FIGS. 4 and 5. In the example of FIGS. 4 and 5, the CTTS includes a voltage application component 140, a signal processor 142, and a plurality of conductive elements 138 that are attached or attachable to the back surface 120 of the first medium 102 and are electronically connected or connectable to the signal processor 142. In an example, the conductive elements 138 may include conductive wire, conductive tape, and/or conductive ink. For sake of clarity, in FIG. 4 two conductive elements 138 are shown connected by leads to the voltage application component and to the signal processor 142. In an example, each of the conductive elements 138 is connected via a cable or wire lead to the voltage application component 140 and the signal processor 142. In another example, each of the conductive elements 138 is connected to the signal processor 142 via a separate lead, or a separate set of leads.

In an example, the kit's conductive elements 138 are pre-attached to the back surface 120 of the first medium 102. In another example, the kit's conductive elements 138 are to be attached to the back surface 120 by a user that is assembling the kit. In an example, the conductive elements 138 that are attached to the back surface 120 of the first medium 102 are positioned within the cavity 110 when the display 116 is fully assembled. In an example, the conductive elements 138 that are attached to the back surface 120 of the first medium 102 by a user are positioned within the cavity 110 when the display 116 is fully assembled. In an example kit, the conductive elements are electronically connected to the signal processor 142 by leads 402. In another example kit, the conductive elements 138 are unconnected, and are to be electronically connected, e.g., via cable or wire leads, to the signal processor 142 by a user that is assembling the display.

The voltage application component 140 is hardware, or a combination of hardware and software, operable to apply a voltage to the conductive elements 138. In an examples the voltage application component may be a battery pack to provide DC current to the conductive elements 138. In another example the voltage application component may be a cord to connect to an electrical outlet to provide AC current to the conductive elements 138. In yet another example the voltage application component may include a transformer to transfer a current from one circuit to one or more other circuits, with a change of voltage. In an example, a kit includes a single voltage application component 140 to be included within the display (e.g., attached to the back surface 120 of the first medium 102 or attached to a support material or support member that is attached to the back surface 120 of the first medium). In another example, the assembled display 116 may include multiple voltage application components 140.

The signal processor 142 is hardware, or a combination of hardware and software, configured to detect an electrical change within a conductive element 138 caused by a user touch. In one example, the electrical change is, or includes, a change in capacitance along the conductive element. In another example, the electrical change is, or includes, a change in resistance or conductance along the conductive element. In yet another example, the electrical change is, or includes, a change in voltage along the conductive element.

The signal processor 142 is configured to interpret the electrical change to identify a command to trigger an action at the device 502 to be controlled. The signal processor 142 is additionally configured to send the identified command to the device 502 to be controlled. In one an example, the signal processor 142 includes, or the kit otherwise provides, an electrical change/command database 608 (FIG. 6) that associates electrical changes with commands to trigger actions at the electronic device 502. In this example, the signal processor 142 is configured to identify a command to trigger a specific action (e.g., to increase audio volume) by accessing the database and utilizing database information that associates the detected first electrical change with the command.

In an example, a kit includes a single signal processor 142 to be included within the display 116 (e.g., attached to the back surface 120 of the first medium 102 or attached to a support material or support member that is attached to the back surface 120 of the first medium). In another example, the assembled display 116 may include multiple signal processors. In an example the signal processor 142 or multiple signal processors 142 are positioned within the cavity 110 of the display 116.

In the example of FIGS. 4 and 5, each of the conductive elements 138 is individually attached to a voltage application component 140 and a signal processor 142 via wire leads 402. In another example, the conductive elements may be individually attached to a voltage application component 140 and/or the signal processor 142 via conductive tape or another conductive material applied at the back surface of the first medium 102 so as to connect the conductive elements 138 to the voltage application component 140 and the signal processor 142.

FIG. 5 illustrates that the CTTS 106 includes an interface 504 to connect the signal processor 142 with the electronic device 502. In examples, the interface 504 may be any type of interface or connector or adapter to connect electronic devices, components, or apparatuses, including, but not limited to, a cable, cable connectors, interface card, card slot and/or port. In another example, the interface 504 includes a wireless transmitter such that the signal processor 142 can, after detecting an electrical change within a conductive element 138 caused by a user touch, and interpreting the electrical change to identify a command to trigger the action, wirelessly send the command to the electronic device 502.

Figure 6:
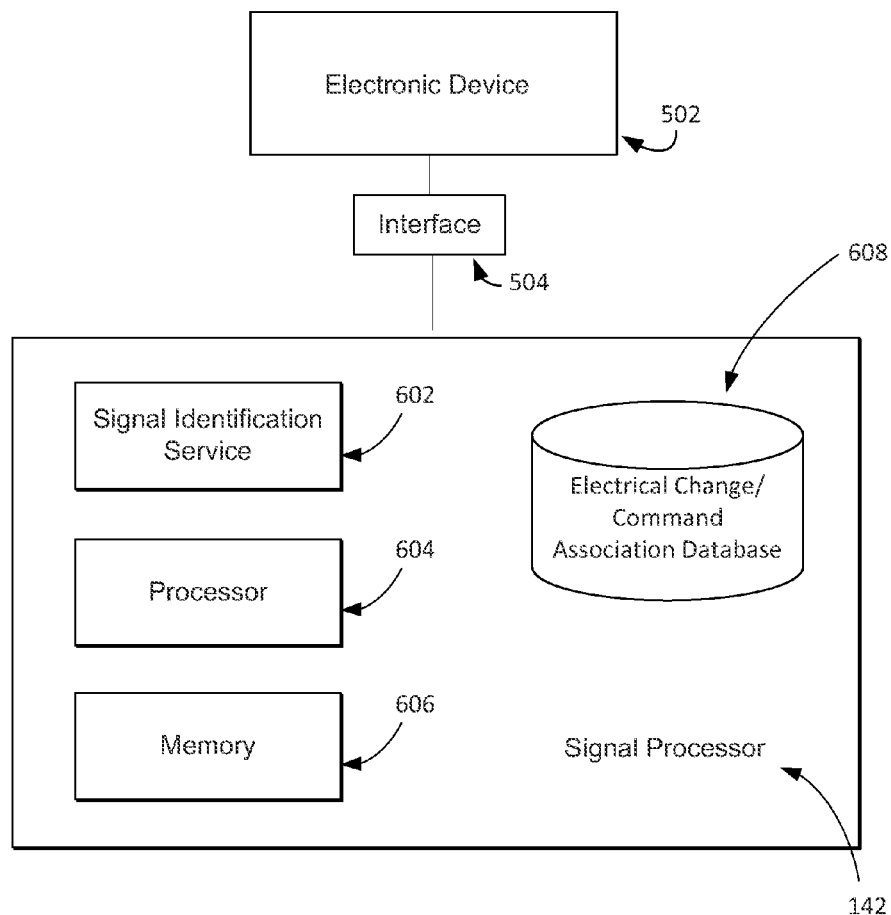
FIG. 6 is a block diagram illustrating a signal processor according to various embodiments.

FIG. 6 is a block diagram illustrating a signal processor according to various embodiments. In the example of FIG. 6, the signal processor 142 includes a signal identification service 602, a processor 604, a memory 606, and an electrical change/command association database 608. Signal identification service 602 represents generally any combination of hardware and programming configured to detect an electrical change within a conductive element 138 (FIG. 1) caused by a user touch, to interpret the electrical change to identify a command to trigger an action at an electronic device 502, and to send the command to the electronic device 502. Examples of such commands include, but are not limited to, commands to start, pause or stop, the electronic device, commands to select content available via the device, and/or commands to select device, volume, brightness, or speed, etc. Signal/command association database 608 represents generally a database, registry, lookup table or list that associates specific changes within a conductive element with specific commands trigger actions at the electronic device 502. Processor 604 represents generally any instruction execution system, such as a computer/processor based system or an ASIC (Application Specific Integrated Circuit), a computer, or other system that can fetch or obtain instructions or logic stored in memory 606 and execute the instructions or logic contained therein. Memory 606 represents generally any memory configured to store program instructions and other data.

In an example, the electronic device 502 to be controlled via user touch is a device that is not included within the kit, but which is attachable to the signal processor 142 via the interface 504 included within the kit. In an example, the electronic device 502 to be controlled via the assembled display 116 (FIG. 1) may be a notebook computer. In other examples, the electronic device 502 to be controlled via the assembled display 116 may be a tablet computer, television, smartphone, MP3 player, stereo receiver, lighting apparatus, electronic door opening apparatus, or any other electronic device.

In another example, the electronic device 502 to receive the command, and thus be controlled by a user touch upon the personalization surface 126 of the display 116, is an electronic device that is included within the kit. For instance, the electronic device 502 may be an audio device to be included with the cavity 110 of the finished display 116, the audio device to cause an audio transmission of songs, speech, or other recorded content that is held in memory within the audio device. In another example, the electronic device 502 may be a radio receiver to be located within the cavity 110 of the finished display 116, the radio receiver to play audio content that is received at the receiver via electromagnetic waves. In another example, the electronic device 502 may be a digital clock that is a part of the kit and to be attached to the personalization surface 126 of the finished display 116.

Figure 7:
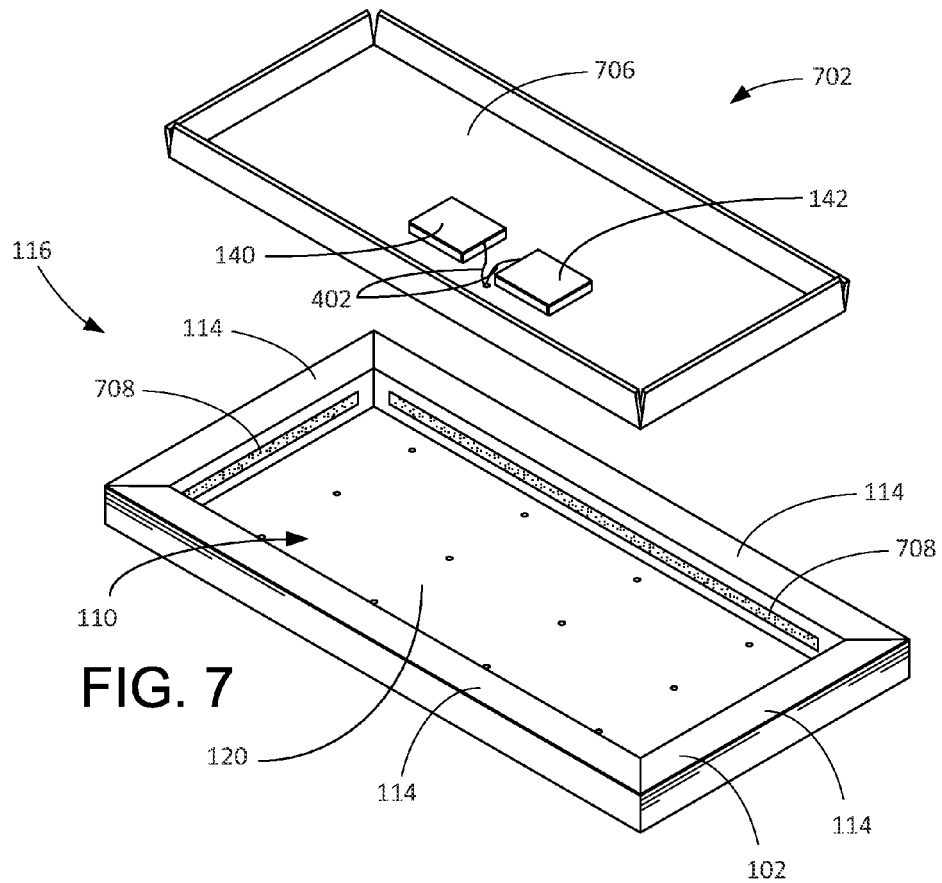
FIG. 7 is a back, perspective view of the assembled display of FIG. 1 with a support member, according to various embodiments.
Figure 8:
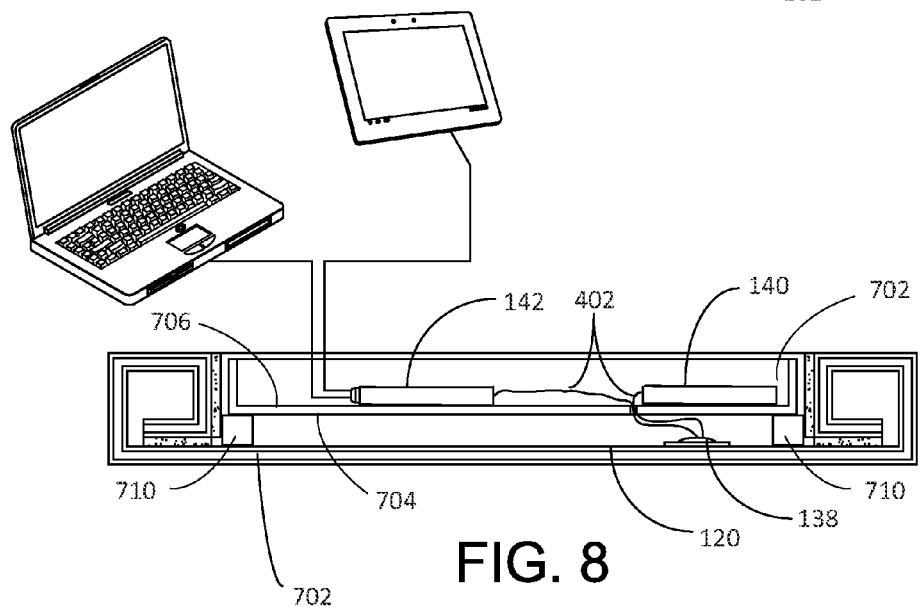
FIG. 8 is a cross-section view of the display of FIG. 7, according to various embodiments.

In another example, the kit of FIG. 1 may also include a support material or support member 702, for insertion into the display 116 adjacent to the back surface 120 of the first medium 102, and within the cavity 110 to provide structural and/or aesthetic advantages for the display 116. FIGS. 7 and 8 illustrate examples of such embodiments. FIG. 7 is a back, perspective, exploded view of an assembled display 116 that includes a folded first medium 102 and an inner support material 702 to be secured to the folded first medium 102, according to various embodiments. FIG. 8 is a cross-section view of the display 116 of FIG. 7, according to various embodiments. In examples, the support member 702 may be a cellulose product, such as a cellulose card stock, corrugated fiberboard or other paperboard. In other examples, the support member 702 may be made of any lightweight foldable material, including, but not limited to a pure element such as an aluminum foil, a compound of multiple elements such as a copper-zinc alloy foil, a synthetic polymer such a polypropylene, or a composite such as PET/CaCO$_3$ coextruded sheet. In an example, the support member 702 and the foldable first medium 102 are made of a same cellulose material. In examples the support member 702 included within the kit may be folded, or foldable (e.g. according to score lines other scoring) to form a cavity.

In the examples of FIGS. 7 and 8, the support member 702 is attachable to the display 116 via a sticky tape, glue, or other adhesive. In another example, the support member 702 is attachable to the display 116 via a sticky tape, glue, or other adhesive 706 that is attached to or part of the support member 702.

In an example, the support member may be positioned in the display 116 via abutment or attachment to a spacer 710 or other structural element that abuts or is attached to the back surface 120 of the folded first medium 102. In an example, the spacer 710 can create space for conductive elements 138 as between the back surface 120 and the support member 702. In an example, the spacer 710 is also to create space for the voltage application component 140 and/or the signal processor 142 as between the back surface 120 and the support member 702. In an example, the kit may include one or more spacer elements 710 that include a plastic, polyurethane, foam, or other lightweight material. In one example, the kit includes one or more spacer elements 710 that are to be installed by user between to the back surface 120 of the first medium 102 and the support member 702. In another example kit, the spacer elements 710 are pre-attached either to the center portion 112 of the back surface 120 of the first medium 102, and/or to the support member 702.

In an example, the voltage application component 140 and the signal processor 142 are attachable to the support member 702. In an example, the support member 702 insert may make the display 116 more sturdy and/or allow for a larger display than would be possible without the insert. In another example, the support member 702 insert may make for a more attractive display 116 by covering or partially covering the conductive elements. In another example, the support member 702 insert may make for a more attractive display 116 by covering or partially covering the signal processor 142. In an example, the signal processor 142 is attachable to a first side 704 of the insert 702 that faces the back surface 120, i.e. is inward-facing when the display 116 is assembled. In another example, the signal processor 142 is attachable to a second side 708 of the insert 702 that is outward-facing when the display 116 is assembled. In this latter embodiment, it may be necessary to create a hole in the insert 702 to allow the leads 402 to pass through the insert 702 and connect the conductive elements 138 to the voltage application component 140 and/or the signal processor 142.

Figure 9:
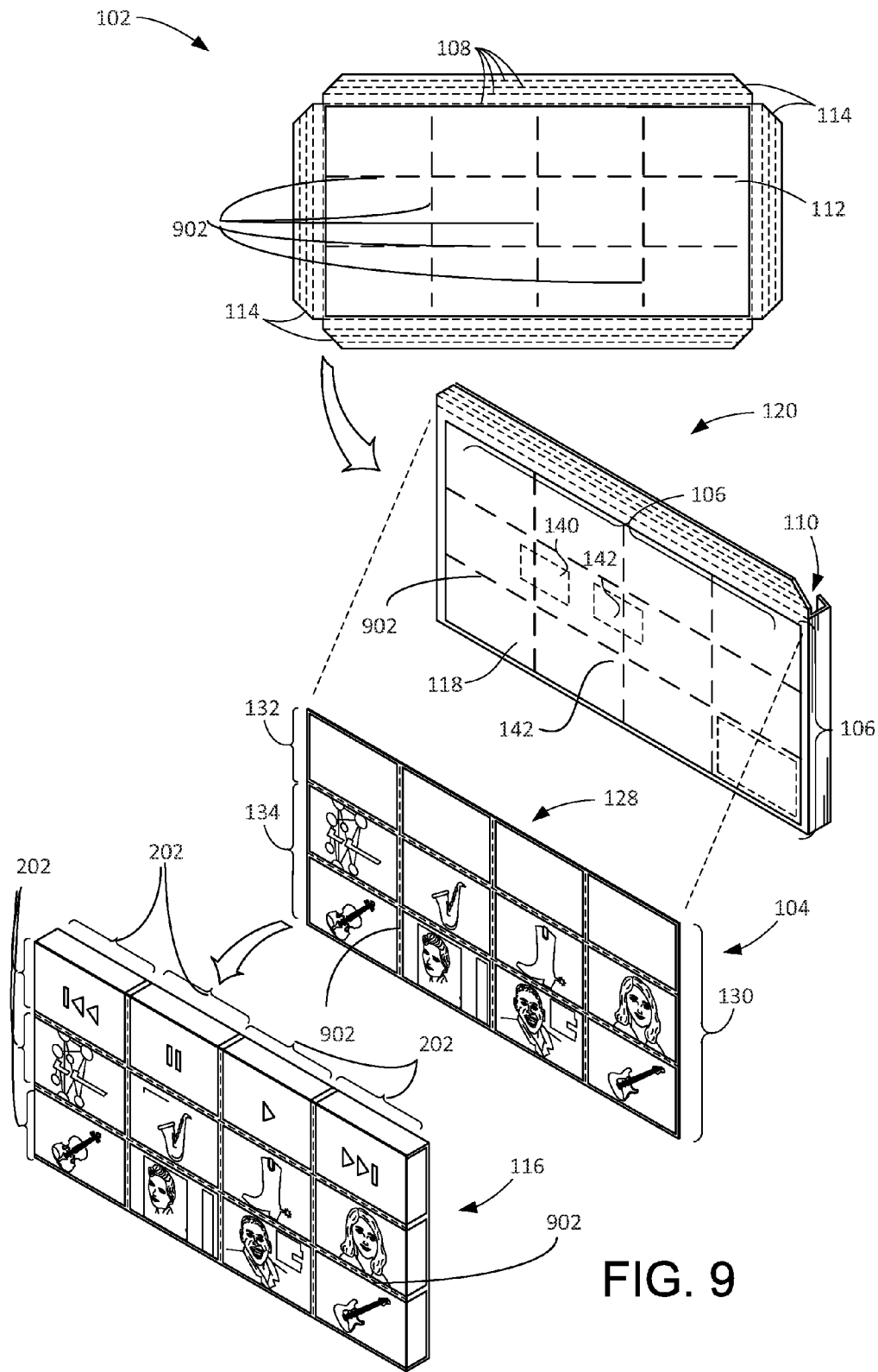
FIG. 9 provides views of a kit to form a display with a foldable first medium, a personalizable second medium, and a conductive touch sensing system, according to various embodiments

FIG. 9 provides views of a kit to form a touch-sensitive display, according to various embodiments. The kit of FIG. 9 includes a foldable first medium 102, a personalizable second medium 104, and a CTTS 106. The first medium 102 includes a center portion 112 and four extensions 114, with each extension to be folded four times according to the score lines 108 on the extension 114 to form a rectangular polygon display 116. The first medium 102 includes an adhesion surface 118 and a back surface 120 that is opposite the adhesion surface 118. The adhesion surface 118 is a surface to receive a personalized second medium 104.

The second medium 104 includes a personalization surface 126 to receive a user selected-image, and includes a rear surface 128 opposite the personalization surface 126 to adhere to the first medium's adhesion surface 118. The second medium 104 may be in the form of, but is not limited to, a cellulose print medium or a polymeric print medium. The personalization surface 126 is to be personalized with a user-selected image 130 to enhance the appearance of the touch-sensitive display, e.g. to render the display appropriate as a standalone household decoration or a wall decoration. In the example of FIG. 9, the personalization surface 126 of the second medium 104 is shown with a user-selected image 130 that has been applied to the personalization surface 126 with a digital printer. In this example, the printed personalization image includes printed device control icons and content type icons 134.

Continuing with the example of FIG. 9, an example kit includes CTTS 106, configured to detect a user touch at the personalization surface and to trigger an action at an electronic device responsive to detection of the touch. In this example, the CTTS includes a conductive wire, conductive tape, or other conductive material that is attached to, or attachable to, the first medium to form a conductive grid 902 that encompasses a plurality of command target areas 202.

In other examples the conductive grid 902 may be embedded in the first medium 102. In examples the conductive element or elements may be in the form of a conductive element pattern other than a grid. In examples the conductive element or elements form a conductive grid or other conductive element pattern that substantially covers the front facing surface of the first medium 102 after a folding operation.

The conductive grid 902 is electronically connected to or connectable to a voltage application component 140 and a signal processor 142. The personalization surface 126 includes a plurality of command target areas 202 with each area encompassed by the conductive grid 902. In the example of FIGS. 1-3, the conductive grid 902 is attached to the back surface of the assembled display 116, so as to encompass the twelve command target areas 202 designated by the device control icons 132 and the content type icons 134 (FIG. 9) that are printed on the personalization surface 126 of the display 116. The conductive grid 902 is configured such that the CTTS will detect a touch at any of the command target areas 202

Each of the command target areas 202 depicted in FIG. 9 refers to a portion of, or geography within, the personalized second medium 104 that is associated with a command to be sent to an electronic device. In this example, the printed device control icons 132 and content type icons substantially define command target areas. In other embodiments, depending upon the type of electronic device to be controlled by the display 116, the icon selection and command target area 202 layout upon the personalization surface 126 will differ from this example.

Figure 10:
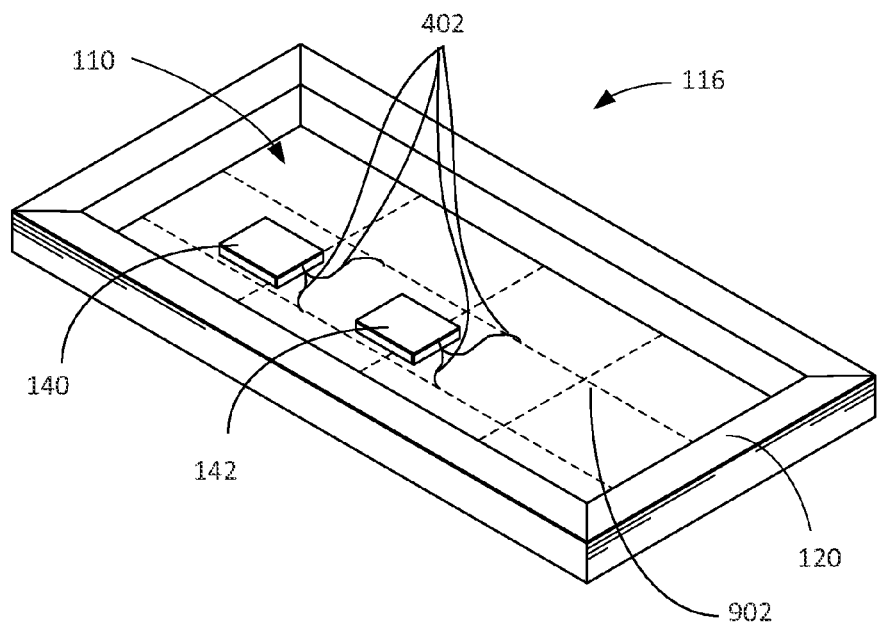
FIG. 10 is a back, perspective view of the assembled display of FIG. 9, according to various embodiments.
Figure 11:
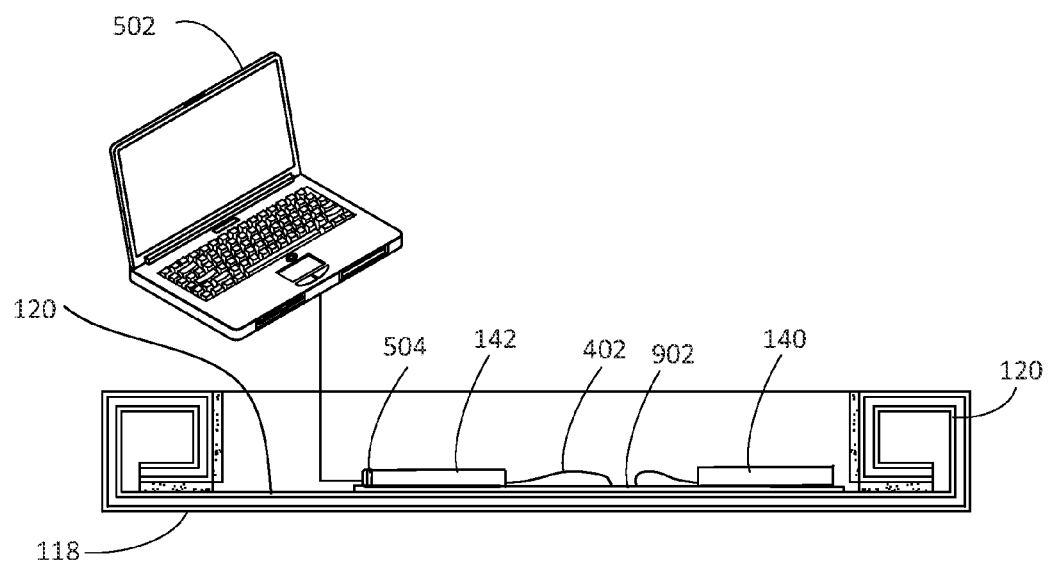
FIG. 11 is a cross-section view of the display of FIG. 9, according to various embodiments.

FIG. 10 is a back, perspective view of the assembled display of FIG. 9, according to various embodiments. FIG. 11 is a cross-section view of the assembled display of FIG. 9, according to various embodiments. In the example of FIGS. 9-11, the CTTS 106 includes a voltage application component 140, a signal processor 142, and a conductive grid 902 that is attached or attachable to the back surface 120 of the first medium 102. The conductive grid 902 is electronically connected or connectable to the signal processor 142. For sake of clarity, in FIG. 10 the conductive grid 902 is shown connected by two leads to the voltage application component and by two leads to the signal processor 142. Other configurations are possible and contemplated by this disclosure.

In an example, the kit's conductive grid 902 is pre-attached to the back surface 120 of the first medium 102. In another example, the kit's conductive grid 902 is to be attached to the back surface 120 by a user that is assembling the kit. In an example, the conductive grid 902 that is attached to the back surface 120 of the first medium 102 is positioned within the cavity 110 when the display 116 is fully assembled. In an example, the conductive grid 902 that is attached to the back surface 120 of the first medium 102 by a user is positioned within the cavity 110 when the display 116 is fully assembled. In an example kit, the conductive grid 902 is electronically connected to the signal processor 142 by leads 402. In another example kit, the conductive grid 902 is unconnected, and is to be electronically connected, e.g., via cable or wire leads, to the signal processor 142 by a user that is assembling the display 116.

The voltage application component 140 is hardware, or a combination of hardware and software, operable to apply a voltage to the conductive grid 902. The signal processor 142 is hardware, or a combination of hardware and software, configured to detect an electrical change within a conductive grid 902 caused by a user touch. In one example, the electrical change is, or includes, a change in capacitance along the conductive grid 902. In another example, the electrical change is, or includes, a change in resistance or conductance along the conductive grid 902. In yet another example, the electrical change is, or includes, a change in voltage along the conductive grid 902. The signal processor 142 is configured to interpret the electrical change to identify a command to trigger an action at the device 502 to be controlled. The signal processor 142 is additionally configured to send the identified command to the device 502 to be controlled.

In the example of FIGS. 9-11, the conductive grid 902 is attached to a voltage application component 140 and a signal processor 142 via wire leads 402. In another example, the conductive grid 902 may be attached to a voltage application component 140 and/or the signal processor 142 via conductive tape applied at the back surface of the first medium. FIG. 11 illustrates an interface 504 that electronically connects the signal processor 142 with the electronic device 502. In examples, the interface 504 may be any type of interface or connector or adapter to connect electronic devices, components, or apparatuses, including, but not limited to, a cable, cable connectors, interface card, card slot and/or port. In another example, the interface 504 includes a wireless transmitter.

Figure 12:
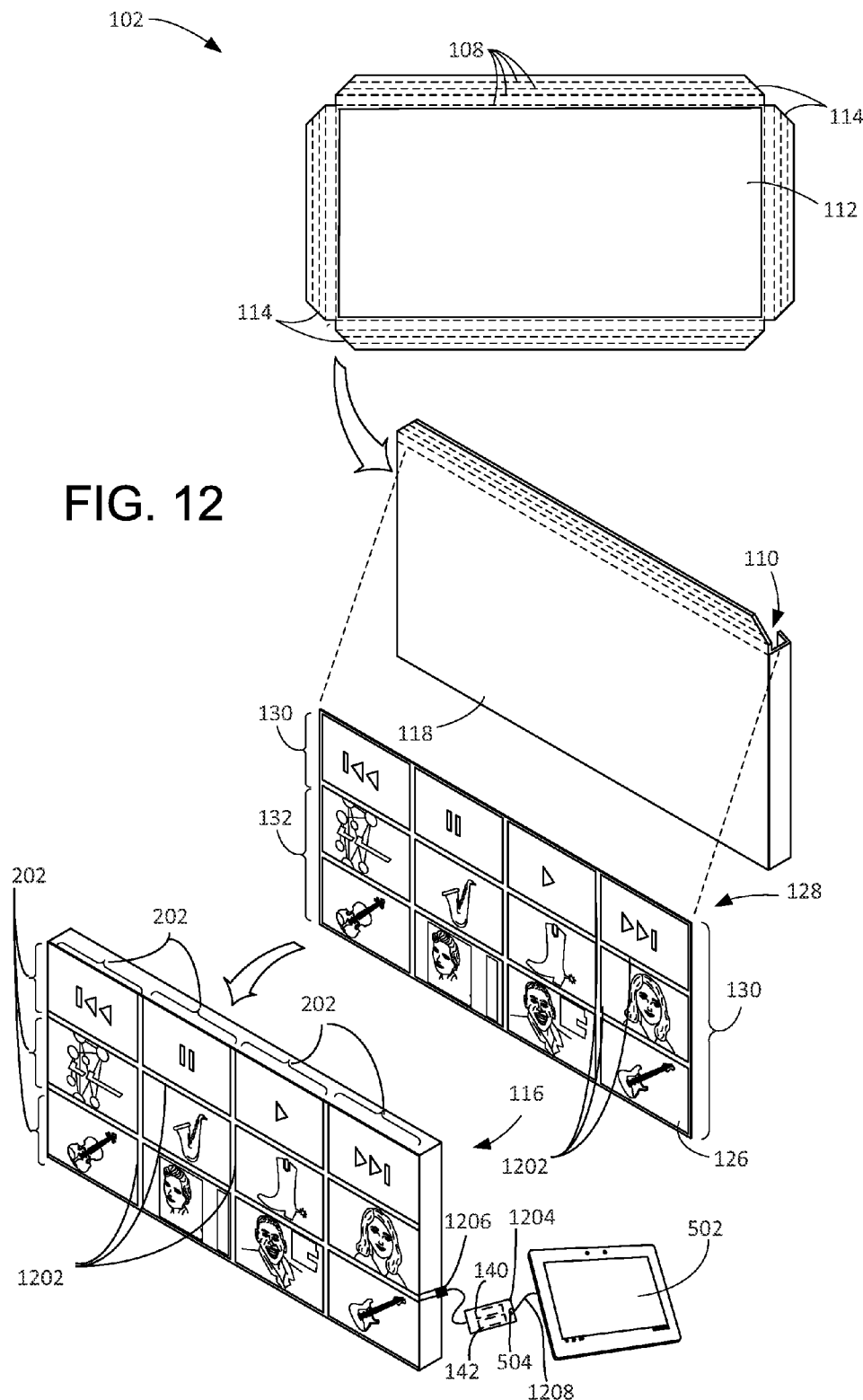
FIG. 12 provides views of a kit to form a display with a foldable first medium, a personalizable second medium, and a conductive touch sensing system, according to various embodiments.

FIG. 12 provides views of a touch-sensitive display, according to various embodiments. The display 116 includes a folded first medium 102, a personalized second medium 104, and a CTTS 106. The first medium 102 includes a center portion 112 and four extensions 114, with each extension folded four times according to the score lines 108 on the extension 114 to form a rectangular polygon display 116. The first medium 102 includes an adhesion surface 118 and a back surface 120 that is opposite the adhesion surface 118. The adhesion surface 118 receives a personalized second medium 104.

The second medium 104 includes a personalization surface 126 that receives a user selected-image, and includes a rear surface 128 opposite the personalization surface 126 that is adhered to the first medium's adhesion surface 118. The personalization surface 126 is personalized with a user-selected image 130 that enhances the appearance of the touch-sensitive display. In the example of FIG. 12, the personalization surface 126 of the second medium 104 is shown with a user-selected image 130 that has been applied to the personalization surface 126 with a digital printer. In this example, the printed personalization image 130 includes printed device control icons 132 and content type icons 134.

Continuing with the example of FIG. 12, an example kit includes a CTTS 106, configured to detect a user touch at the personalization surface 126 and to trigger an action at an electronic device 502 responsive to detection of the touch. In this example, the CTTS includes a conductive element, including conductive ink applied to the personalization surface 126. In this example, the conductive ink is applied to form a conductive ink grid 1202 that defines the command target areas. In another example the conductive ink grid 1202 may be pre-applied to the second medium 104 that is included within a kit. In other examples the conductive ink may be applied or is pre-applied in a form or pattern other than a grid. For instance, in the example of FIG. 12 the conductive ink that is used to print the device control icons 132 and content type icons 134 is conductive ink, such that a user touch upon the personalization surface 126 at or near the printed icon will create an electrical change in a conductive element that includes the conductive ink. Examples of such changes include a change in capacitance along a path or circuit created by the conductive ink, a change in resistance or conductance along the path or circuit created by the conductive ink. In yet another example, the electrical change is, or includes, a change in voltage along the path or circuit created by the conductive ink.

The conductive ink grid 1202 is electronically connected to or connectable to a voltage application component 140 and a signal processor 142. In the example of FIG. 12, the conductive ink grid 1202 is printed or otherwise applied on the personalization surface 126 of the second medium 104. In this manner, the conductive ink grid 1202 encompasses the twelve command target areas 202 designated by the device control icons 132 and the content type icons 134.

In the example assembled display of FIG. 12 the conductive ink grid 1202 is electronically connected to a multipurpose component 1204 that includes the voltage application component 140 and the signal processor 142. In this example, the electrical connection is made via an instance of conductive tape 1206 that is applied to connect the conductive ink grid 1202 and a wire lead 1208 of the multipurpose component 1204. In this example, an interface 504 connects the signal processor 142 and the voltage application component 140 to the electronic device 502 to be controlled via a user touch at the display 116. In another example, the conductive ink grid 1202 may be attached to a voltage application component 140 and/or the signal processor 142 via another conductive means, such as by utilizing a conductive glue or a conductive clamp. Other configurations that connect the conductive ink grid 1202 to the voltage application component 140 and the signal processor 142 are possible and are contemplated by this disclosure.

Various modifications may be made to the disclosed embodiments and implementations without departing from their scope. Therefore, the illustrations and examples herein should be construed in an illustrative, and not a restrictive, sense.

What is claimed is:

1. A kit for making of a touch-sensitive personalized display, comprising:
   a first medium foldable according to score lines to form a cavity, the first medium including:
      an adhesion surface to receive a personalized second medium,
      a removable liner positioned on the adhesion surface, and
      a back surface opposite the adhesion surface;
   the personalized second medium including a personalization surface to receive an image, and including a rear surface opposite the personalization surface to be adhered to the first medium's adhesion surface after removal of the removable liner;
   a conductive touch sensing system to detect a touch at the personalization surface and to trigger an action at an electronic device responsive to detection of the touch, the conductive touch sensing system comprising a number of conductive elements embedded into the first medium;
   a support member for insertion into the display adjacent to the back surface and within the cavity; and
   a number of spacers placed between the support member and the back surface of the first medium;
   wherein the spacers form a space within the cavity between the back surface of the first medium and the support member to prevent the support member from touching the number of conductive elements.

2. The kit of claim 1, wherein the first medium includes a center portion having at least three extensions, and each extension is to be folded at least three times according to the score lines on the extension.

3. The kit of claim 1, wherein the image is to be printed to the personalization surface using a digital printer chosen from a thermal inkjet printer, a piezoelectric inkjet printer, an electrophotographic printer, and a liquid electrophotographic printer.

4. The kit of claim 1, wherein the conductive touch sensing system includes:
   a voltage application component and a signal process electronically connected to the number of conductive elements;
   the voltage application component, to apply a voltage to the number of conductive elements;
   the signal processor, to detect an electrical change within the number of conductive elements caused by a touch, and to interpret the electrical change to identify a command to trigger the action, and to send the command to the device; and
   an interface to connect the signal processor with the electronic device.

5. The kit of claim 4, wherein the electrical change is a change in capacitance.

6. The kit of claim 4, wherein the electrical change is a change in resistance or conductance.

7. The kit of claim 4, wherein the electrical change is a change in voltage.

8. The kit of claim 4, wherein the conductive element includes a conductive ink applied to the personalization surface at a command target area.

9. The kit of claim 4, wherein the conductive element includes a conductive ink applied to the personalization surface to form a grid or other pattern that encompasses a plurality of command target areas.

10. The kit of claim 4, wherein the conductive element includes a conductive wire or conductive tape embedded in, attached to, or attachable to the first medium, to detect a touch at a command target area.

11. The kit of claim 4, wherein the conductive element includes a conductive wire or conductive tape embedded in, attached to, or attachable to the first medium to form a grid or other pattern of that encompasses a plurality of command target areas.

12. The kit of claim 4, wherein the signal processor is positioned within the cavity.

13. The kit of claim 4, wherein the electrical change is a first electrical change and the command is a first command;
   further comprising a database associating electrical changes with commands to trigger actions at the electronic device; and
   wherein the signal processor identifies the first command by associating the first command with the first electrical change via the database.

14. A touch-sensitive personalized display, comprising:
   a first medium including:
      a front surface and an opposed back surface and at least three sides, and
      an extension for each of the sides, with each extension folded towards the back surface at least three times according to score lines to form a cavity;
   a second medium adhered to the front surface, the medium including a personalization surface upon which an image has been printed via a digital printer, and including a rear surface opposite the personalization surface that was adhered to the first medium's back surface;

a conductive touch sensing system comprising a number of conductive elements positioned at least partially within the cavity, to trigger an action at an electronic device; and a support member for insertion into the display adjacent to the back surface and within the cavity and separated from the back surface a distance by a number of spacers forming a space into which a portion of the number of conductive elements and associated electrical wires connecting the number of conductive elements to an application component and a signal processor fits.

15. The display of claim 14, wherein the electrical change is a change in capacitance, resistance, conductance, or voltage along the conductive element.

16. The display of claim 14, wherein the conductive element includes a conductive ink, conductive wire, or conductive tape applied to the personalization surface at a command target area.

17. The display of claim 14, wherein the conductive element includes a conductive ink, conductive wire, or conductive tape applied to the personalization surface to form a grid or other pattern that encompasses a plurality of command target areas.

18. The display of claim 14, wherein the personalization surface designates a plurality of command target areas, with each area having an associated conductive element to detect a touch within that area.

19. A kit for making a touch-sensitive personalized display to function as an, comprising:

a first medium foldable according to score lines to form a cavity, the first medium including:

an adhesion surface to receive a personalized second medium, and a back surface opposite the adhesion surface;

a center portion having at least three extensions, and each extension is to he folded at least three times according to the score lines on the extension;

the second medium including a personalization surface to receive an image, and including a rear surface opposite the personalization surface to be adhered to the first medium's adhesion surface;

a conductive touch sensing system to detect a touch at the personalization surface and to trigger an action at an electronic device responsive to detection of the touch, the conductive touch sensing system to be attached to the back surface, and including:

a conductive element electronically connected to or connectable to a voltage application component and a signal processor;

the voltage application component, to apply a voltage to the conductive element;

the signal processor, to detect an electrical change within the conductive element caused by a touch, and to interpret the electrical change to identify a command to trigger the action, and to send the command to the device; and an interface to connect the signal processor with the electronic device; and a support member for insertion into the cavity and separated from the back surface of the first medium by a number of spacers, wherein a space is created between the support member and the back surface by a number of spacers that form a cavity into which a portion of the conductive element fits.

* * * * *